United States Patent
Keller et al.

(10) Patent No.: US 7,047,507 B2
(45) Date of Patent: May 16, 2006

(54) SYSTEM AND METHOD FOR DETERMINING WIRE CAPACITANCE FOR A VLSI CIRCUIT

(75) Inventors: S. Brandon Keller, Evans, CO (US); Gregory Dennis Rogers, Fort Collins, CO (US); George Harold Robbert, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 324 days.

(21) Appl. No.: 10/647,597

(22) Filed: Aug. 25, 2003

(65) Prior Publication Data

US 2005/0050491 A1    Mar. 3, 2005

(51) Int. Cl.
G06F 17/50 (2006.01)
G06F 9/45 (2006.01)

(52) U.S. Cl. .................... 716/5; 716/4; 716/6
(58) Field of Classification Search .............. 716/5, 716/1, 3, 4, 6
See application file for complete search history.

(56) References Cited

U.S. PATENT DOCUMENTS

| | | | |
|---|---|---|---|
| 5,812,416 A | 9/1998 | Gupte et al. | |
| 5,825,660 A | 10/1998 | Cagan et al. | |
| 5,831,869 A | 11/1998 | Ellis et al. | |
| 6,028,991 A * | 2/2000 | Akashi | 716/14 |
| 6,185,722 B1 | 2/2001 | Darden et al. | |
| 6,230,299 B1 * | 5/2001 | McSherry et al. | 716/1 |
| 6,308,304 B1 | 10/2001 | Devgan et al. | |
| 6,363,516 B1 * | 3/2002 | Cano et al. | 716/5 |
| 6,480,987 B1 * | 11/2002 | McBride | 716/5 |
| 6,523,149 B1 | 2/2003 | Mehrotra et al. | |
| 6,526,562 B1 | 2/2003 | Haddad et al. | |
| 6,587,999 B1 * | 7/2003 | Chen et al. | 716/6 |
| 6,772,404 B1 * | 8/2004 | Tanaka | 716/10 |
| 6,807,520 B1 * | 10/2004 | Zhou et al. | 703/14 |
| 6,931,613 B1 * | 8/2005 | Kauth et al. | 716/5 |
| 2002/0002701 A1 | 1/2002 | Usami et al. | |
| 2002/0010901 A1 | 1/2002 | Otaguro | |
| 2002/0023255 A1 | 2/2002 | Karniewicz | |

(Continued)

FOREIGN PATENT DOCUMENTS

JP        07334532 A      12/1995

OTHER PUBLICATIONS

Keller, S. Brandon; Rogers, Dennis R.; Lelm, Charles A.; U.S. Appl. No. 10/706,682, Entitled: Method And Program Product For Determining Nets Requiring Detailed Electromigration And Self Heating Analysis In A Digital Integrated Circuit; filed Nov. 12, 2003.

(Continued)

*Primary Examiner*—Stacy A. Whitmore
*Assistant Examiner*—Magid Y. Dimyan

(57) ABSTRACT

A method and system for determining wire capacitance for a VLSI circuit design, comprising determining all hierarchical blocks of a portion of the design; storing, for a plurality of the blocks, indicia of the most accurate one of a plurality of wire capacitance data sources; generating a wire capacitance database with an entry for each net in at least a plurality of the blocks, using information stored in at least one of the wire capacitance data sources; generating a hierarchical connectivity model for the design; and using the hierarchical connectivity model and said wire capacitance database to determine a cumulative wire capacitance value for each HLSN in each of the blocks in a portion of the design to be analyzed.

21 Claims, 3 Drawing Sheets

U.S. PATENT DOCUMENTS

| | | | | |
|---|---|---|---|---|
| 2003/0051222 | A1* | 3/2003 | Williams et al. | 716/12 |
| 2003/0237067 | A1* | 12/2003 | Mielke et al. | 716/6 |
| 2004/0044972 | A1 | 3/2004 | Rohrbaugh et al. | |
| 2004/0078767 | A1* | 4/2004 | Burks et al. | 716/8 |
| 2004/0199880 | A1* | 10/2004 | Kresh et al. | 716/4 |

OTHER PUBLICATIONS

Keller, S. Brandon; Rogers, Dennis R.; Lelm, Charles A.; U.S. Appl. No. 10/706,698, Entitled: Method And Program Product For Performing Self-Heating Analysis In A Digital Integrated Circuit Through A Single Cycle Transient Simulation; filed Nov. 12, 2003.

Keller, S. Brandon; Rogers, Dennis R.; Lelm, Charles A.; U.S. Appl. No. 10/706,376, Entitled: Method And Program For Visual Display and One-Click Repair Of Electromigration And Self Heating Design-Rule Violations In A Digital Integrated Circuit Layout Database; filed Nov. 12, 2003.

Keller, S. Brandon; Rogers, Dennis R.; Lelm, Charles A.; U.S. Appl. No. 10/706,501, Entitled: Method And Program Product For Performing Electromigration Analysis In A Digital Integrated Circuit By Converting A Netlist To A DC Model And Performing DC Analysis Of The DC Model; filed Nov. 12, 2003.

Keller, S. Brandon; Rogers, Dennis R.; Lelm, Charles A.; U.S. Appl. No. 10/706,526, Entitled: Method And Program Product For Performing A Worst Case Electromigration And Self Heating Analysis In A Digital Integrated Circuit With Worst-Case Superposition Of Partial Currents; filed Nov. 12, 2003.

Keller, S. Brandon; Rogers, Dennis R.; Lelm, Charles A.; U.S. Appl. No. 10/706,692, Entitled: Method And Program Product For Performing Electromigration Analysis In A Digital Integrated Circuit Through A Single Cycle Transient Simulation; filed Nov. 12, 2003.

Keller, S. Brandon; Rogers, Dennis R.; Lelm, Charles A.; U.S. Appl. No. 10/706,508, Entitled: Method And Program Product For Performing Self-Heating Analysis In A Digital Integrated Circuit Layout Database by Substituting Resistive Models For Active Devices; filed Nov. 12, 2003.

Keller, S. Brandon; Rogers, Dennis R.; Robberts, George H.; U.S. Patent Application filed under EV210655516US; Entitled: Method And Program Product For Determining Worst Case Currents In A Digital Integrated Circuit Through Worst-Case Superposition Of Partial Currents; filed Jan. 30, 2004.

Keller, S. Brandon; Rogers, Dennis R.; Robberts, George H.; U.S. Patent Application filed under EV210655564US; Entitled: Systems And Methods For Re-Using Circuit Design Analysis Results; filed Jan. 30, 2004.

Keller, S. Brandon; Rogers, Dennis R.; Robberts, George H.; U.S. Patent Application filed under EV210655581US; Entitled: System And Method For Determining Detail Of Analysis In A Circuit Design; filed Jan. 30, 2004.

Keller, S. Brandon; Rogers, Dennis R.; Robberts, George H.; U.S. Patent Application filed under EV210655595US; Entitled: Systems And Methods That Identify Equivalent Instantiation-Specific Configuration Information For Analysis Tools; filed Jan. 30, 2004.

Keller, A. Brandon; Rogers, Dennis R.; Robberts, George H. & Stevens, Scott Alan; U.S. Patent Application filed under EV210655520US; Entitled System And Method To Limit Analyzed Current Flow In A Circuit Design; filed Jan. 30, 2004.

Keller, S. Brandon; Rogers, Dennis R.; Robberts, George H.; U.S. Patent Application filed under EV210655533US; Entitled: System And Method For Processing Configuration Information; filed Jan. 30, 2004.

Keller, S. Brandon; Rogers, Dennis R.; Robberts, George H.; U.S. Patent Application filed under EV210655555US; Entitled: System And Method For Balancing Run-Time And Result Accuracy In A Circuit Design Analysis Tool; filed Jan. 30, 2004.

Keller, S. Brandon; Rogers, Dennis R.; Robberts, George H.; U.S. Patent Application filed under EV210655578US; Entitled: System And Method For Indicating Logic State Combinations Used During Circuit Design Analysis; filed Jan. 30, 2004.

Keller, S. Brandon; Rogers, Dennis R.; Robberts, George H.; U.S. Patent Application filed under EV210655547US; Entitled: System And Method For Determining Control Signal Combinations For Use During Simulation Of A Stage Of A Circuit Design; filed Jan. 30, 2004.

* cited by examiner

SYSTEM AND METHOD FOR DETERMINING WIRE CAPACITANCE FOR A VLSI CIRCUIT

RELATED APPLICATIONS

The present document contains material related to the material of copending, cofiled, U.S. patent application Ser. No. 10/647,595, entiled System And Method For Determining Applicable Configuration Information For Use In Analysis Of A Computer Aided Design; U.S. patent application Ser. No. 10/647,687, entitled Systems And Methods Utilizing Fast Analysis Information During Detailed Analysis Of A Circuit Design; U.S. patent application Ser. No. 10/647,594, entitled Systems And Methods For Determining Activity Factors Of A Circuit Design; U.S. patent application Ser. No. 10/647,768, entitled System And Method For Determining A Highest Level Signal Name In A Hierarchical VLSI Design; U.S. patent application Ser. No. 10/647,606, entitled System And Method For Determining Connectivity Of Nets In A Hierarchical Circuit Design; U.S. patent application Ser. No. 10/647,596, entitled System And Method Analyzing Design Elements In Computer Aided Design Tools; U.S. patent application Ser. No. 10/647,608, entitled System And Method For Determining Unmatched Design Elements In A Computer-Automated Design; U.S. patent application Ser. No. 10/647,598, entitled Computer Aided Design Systems And Methods With Reduced Memory Utilization; U.S. patent application Ser. No. 10/647,688, entitled System And Method For Iteratively Traversing A Hierarchical Circuit Design; U.S. patent application Ser. No. 10/647,769, entitled Systems And Methods For Establishing Data Model Consistency Of Computer Aided Design Tools; U.S. patent application Ser. No. 10/647,607, entitled Systems And Methods For Identifying Data Sources Associated With A Circuit Design; and U.S. patent application Ser. No. 10/647,605, entitled Systems And Methods For Performing Circuit Analysis On A Circuit Design, the disclosures of which are hereby incorporated herein by reference.

BACKGROUND

Computer aided design (CAD) tools, including computer aided engineering (CAE) tools, are used to create and analyze various types of designs. An E-CAD tool is a type of CAD tool that is used for creating and analyzing electronic designs. E-CAD tools that analyze VLSI designs typically operate on a single type of wire capacitance data. It is advantageous, however, to allow analysis tools to operate on the best available data, which may originate from different data sources, so that analysis may be performed on blocks of a VLSI design that are not completely drawn or laid out, for example. An existing technique attempts to generate a hierarchical data model from mixed-mode data sources, but this technique may generate inconsistencies in the data model that result from mismatched connectivity data, thereby preventing accurate circuit analysis.

SUMMARY

A process of determining wire capacitance for a VLSI circuit design is described. In one embodiment, the process comprises determining all hierarchical blocks of a portion of the design; storing, for a plurality of the blocks, indicia of the most accurate one of a plurality of wire capacitance data sources; generating a wire capacitance database with an entry for each net, in at least a plurality of the blocks, using information stored in at least one of the wire capacitance data sources; generating a hierarchical connectivity model for the design; and using the hierarchical connectivity model and the wire capacitance database to determine a cumulative wire capacitance value for each HLSN (highest level signal name) in each of the blocks in the portion of the design to be analyzed.

In one embodiment, the hierarchical connectivity model for the design is generated by using layout connectivity, if extracted layout data is available for a given block; otherwise, if no layout is available for the block, then by using schematic connectivity data.

In an alternative embodiment, the hierarchical connectivity model for the design is generated by using a single type of connectivity data for each of the blocks, where a single type of data is selected from either layout or a schematic diagram.

DETAILED DESCRIPTION

Definitions

A net is a single electrical path in a circuit design that has the same electrical characteristics at all of its points. Any collection of wires that carries the same signal between components is a net. If the components allow the signal to pass through unaltered (as in the case of a terminal), then the net continues on subsequently connected wires. If, however, the component modifies the signal (as in the case of a transistor or a logic gate), then the net terminates at that component and a new net begins on the other side. In the present document, a net may be considered to be subdivided into net 'pieces', each of which is part of a 'highest level signal name', or HLSN. An HLSN is the unique signal name that identifies a collection of local block nets or 'hierarchical net pieces', which are the small pieces of wire (nets) in each hierarchical block of a circuit design. A netlist lists the components and the nets associated with the circuit design.

A significant characteristic of VLSI and other types of circuit design is a reliance on hierarchical description. A primary reason for using hierarchical description is to hide the vast amount of detail in a design. By reducing the distracting detail to a single object that is lower in the hierarchy, one can greatly simplify many CAD operations. For example, simulation, verification, design-rule checking, and layout constraints can all benefit from hierarchical representation, which makes them more computationally tractable. Since many circuits are too complicated to be easily considered in their totality, a complete design is often viewed as a collection of component aggregates that are further divided into sub-aggregates in a recursive and hierarchical manner. In VLSI design, these aggregates are commonly referred to as blocks (or cells); the use of a block at a given level of hierarchy is called an 'instance'.

Figure 1:
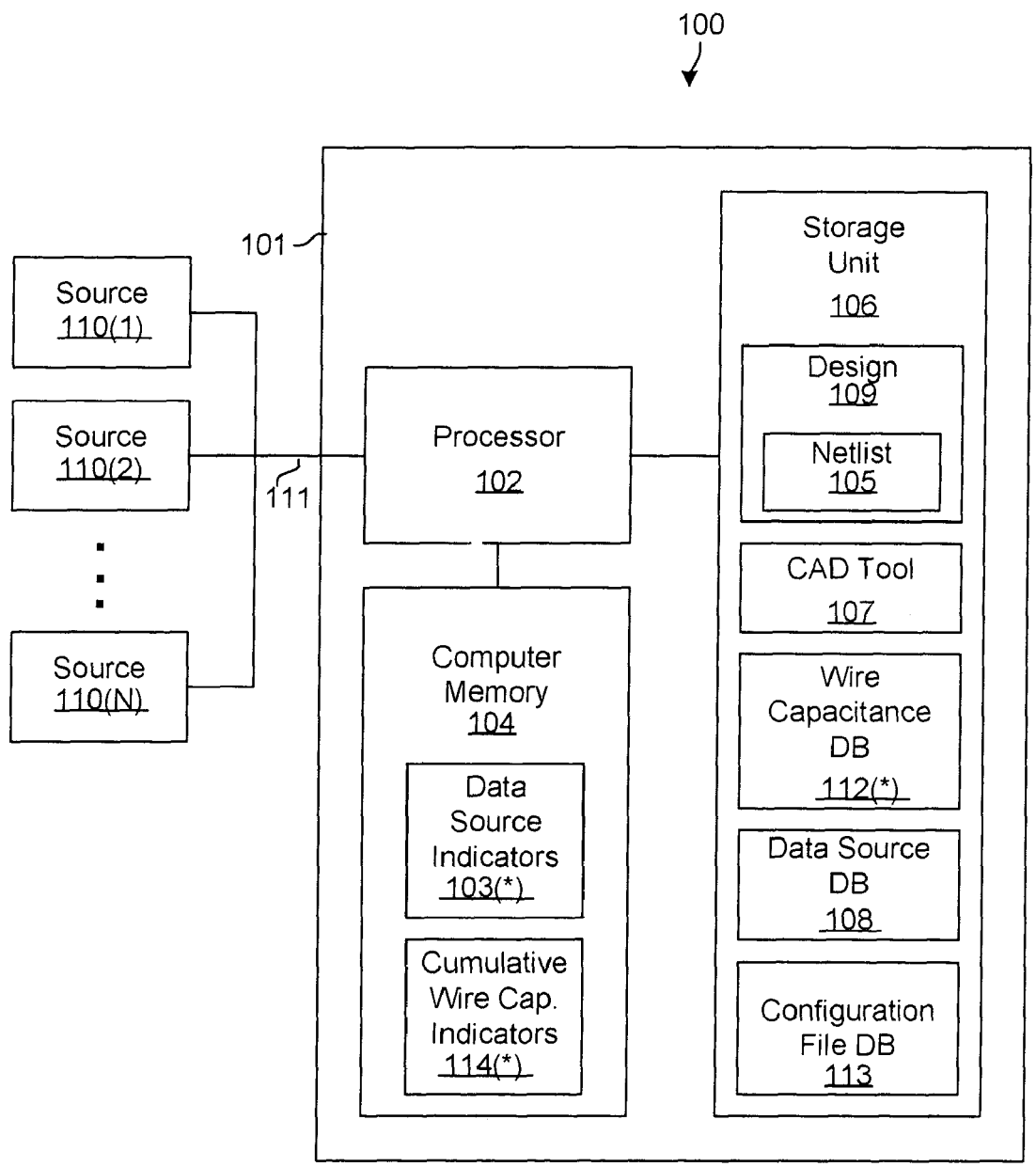
FIG. 1 is a block diagram of one embodiment of an exemplary CAD system for selecting wire capacitance data for a VLSI netlist.

FIG. 1 is a block diagram of one embodiment of an exemplary CAD system 100 configured for selecting wire capacitance data for a VLSI design 109, in accordance with one embodiment of the present system. As shown in FIG. 1, CAD system 100 includes computer system 101 and CAD tool 107. Design 109 includes a netlist 105 for a hierarchical VLSI design developed by CAD tool 107. Computer system 101 includes processor 102, computer memory 104, and storage unit 106. In computer system 101, processor 102 is coupled to computer memory 104 and to storage unit 106.

In one embodiment of the present system, CAD tool 107 may initially reside in storage unit 106 as software instructions. Upon initializing CAD tool 107, software instructions that form CAD tool 107 are loaded in computer memory 104. At least part of design 109, including netlist 105 is loaded in computer memory 104 upon initialization of CAD tool 107. Processor 102 then executes the software instructions, as described below with respect to FIG. 2.

In CAD system 100, processor 102 controls operation of the system, and also functions to combine data from wire capacitance value sources 110(1), 110(2) . . . 110(N), hereinafter referred to as wire capacitance sources 110(*). Wire capacitance sources 110(*) may include user input, design analyzers, CAD tool estimators, and the like. In CAD system 100, processor 102 is coupled to each of wire capacitance sources 110(*) through link 111. For example, source 110(1) may be a user input that provides a wire capacitance value of a first design element, while source 110(2) may be a CAD tool estimator that provides a wire capacitance value of a second design element, and source 110(N) may provide a value of wire capacitance for a third design element of the design as determined by the analysis of the design by an E-CAD tool. The term 'design element' may be used to refer to any component that is part of a design, and, as used herein, typically refers to a net, which is a wire or other element, that connects two components of a VLSI circuit. It is to be noted that the present system may determine design element characteristics other than wire capacitance.

The wire capacitance values used by the present system may, for example, be generated from an analysis of a design block by a wire capacitance source 110(*) such as a design analyzer and/or a CAD tool estimator. Examples of types of analyses performed by such a source 110(*) includes, for example, analyzing capacitances, resistances, and leakage currents of various design elements. Each of wire capacitance sources 110(*) generates a value for the wire capacitance of a particular net and a data source indicator 103 that indicates the source of the wire capacitance data (e.g., wire capacitance values acquired through an E-CAD tool functioning as a capacitance estimator source).

In an exemplary embodiment of the present system, processor 102 uses the 'best available' wire capacitance data, i.e., data from the source considered by a design engineer to be the most accurate, for each of the nets of a hierarchical VLSI design. For each block within the hierarchical design, the best available data source [e.g., one of sources 110(*)] for analyzing the block is stored by name in data source database 108 of storage unit 106. Processor 102 reads entries in a wire capacitance sub-database 112(*), based on the block name in data source database 108, to generate wire capacitance values for each block under analysis based on each data source in database 108. Processor 102 additionally functions as a summation tool that reads each value associated with each source and sums the values for the associated block of the design. Processor 102 may also generate an estimation of the particular characteristic if any values stored in data source database 108 contain missing information.

It should be noted that processor 102 may incorporate the functionality of sources 110(*). For example, items 110(1), 110(2) . . . 110(N) may take the form of one or more software modules resident within computer memory 104 and/or inputs to computer memory 104.

Figure 2:
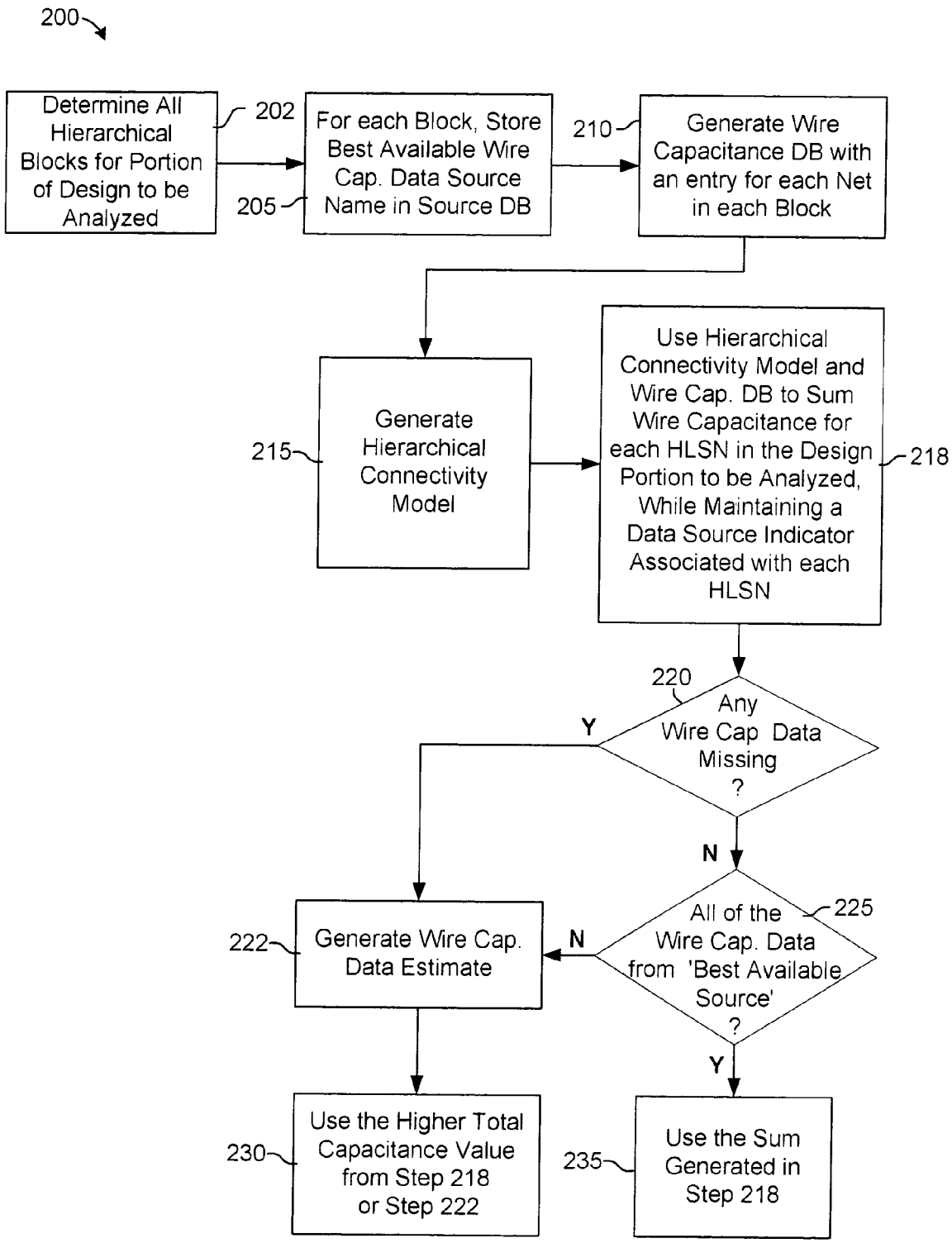
FIG. 2 is a flowchart illustrating exemplary steps that may be performed during operation of the CAD system of FIG. 1.
Figure 3:
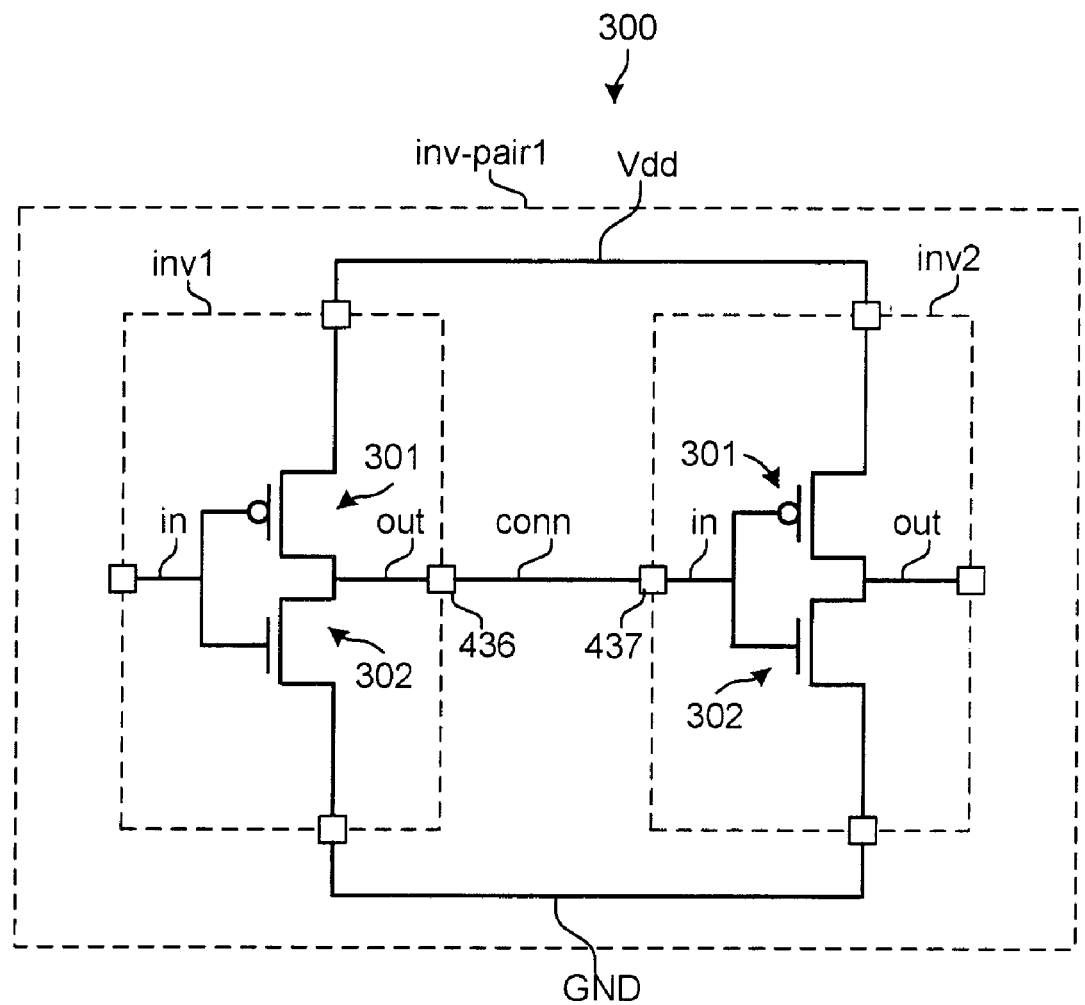
FIG. 3 is an example of a portion of a hierarchical design to be analyzed by the CAD system of FIG. 1.

FIG. 2 is a flowchart illustrating exemplary steps performed during operation of the CAD system 100 of FIG. 1. FIG. 3 is an example of a portion of a hierarchical design to be analyzed by the CAD system 100 of FIG. 1, and represents a hierarchical connectivity model, as explained below with respect to step 215. Operation of the present system is best understood by viewing FIGS. 1, 2, and 3 in conjunction with one another. As shown in FIG. 2, operation 200 commences at step 202, wherein processor 102 determines all of the hierarchical blocks for the portion of design to be analyzed. In the following example, the design portion 300 to be analyzed is shown in FIG. 3 as consisting of a highest level block 'inv-pair', which comprises two hierarchically lower blocks 'inv1' and 'inv2', each of which is an instance of block 'inv*'.

At step 205, for each hierarchical block in the design portion of interest, processor 102 retrieves the best available wire capacitance data source name from a configuration file in database 113, and stores this name and the type of data source (e.g., layout or schematic connectivity) in data source database 108 in a record associated with the corresponding block. There is only one data source database 108 for the entire run of the present analysis, and that database has one record for each block in the design portion of interest. In the present example, assume that the 'best available' source name for block 'inv-pair' is layout 'source_110(1)', and the 'best available' data source for both blocks 'inv1' and 'inv2' is schematic 'source_110(2)', since both of these blocks are instances of the same block, 'inv*'. In an exemplary embodiment, each record created in data source database 108 includes the block name, the type of data source, and the name of the data source directory and data file therein containing the wire capacitance data for the associated block, as shown in Table 1 below (in which other database entries and other information have been omitted for simplicity).

TABLE 1

| DATA SOURCE DATABASE 108 | | |
|---|---|---|
| Block Name | Type | Data Source Directory/Data File |
| inv-pair | layout | source_110(1)/hier_cap.1 |
| inv* | schematic | source_110(2)/hier_cap.2 |

In the present example, it can be seen from Table 1 that the 'best available' data for the 'inv-pair' block is layout data, which is found in the data source directory 'source_110(1)'; and that the corresponding wire capacitance for each net in that block can be found in wire capacitance sub-database 'hier_cap.1'. Likewise, the 'best available' data for the 'inv*' block is schematic data, which is found in the data source directory 'source_110(2)'; and the corresponding wire capacitance for each net in that block can be found in wire capacitance sub-database 'hier_cap.2'.

At step 210, a plurality of wire capacitance sub-databases 112(*) are generated by processor 102, by retrieving wire capacitance data from one or more data sources 110(*) to produce an entry in the wire capacitance database for each block net in the design portion of interest. Each wire capacitance sub-database 112(*) contains a record, for each block in a particular net, that provides the wire capacitance for that net. There is a wire capacitance sub-database 112(*) for each block in the portion of the design to be analyzed. Since all nets in a block share the same data source, it is not necessary to associate a data source with each net, but only to maintain the data source—block name association, as shown in Table 1.

Records for block nets inv-pair/conn, inv*/in, and inv*/out are shown in Table 2, below (other block nets in the design portion of interest are omitted for simplicity):

TABLE 2

WIRE CAPACITANCE SUB-DATABASES 112(*)

| Net | Capacitance |
|---|---|
| Data source directory: source_110(1)/ Wire capacitance sub-database: hier_cap.1: | |
| conn | 0.03 pF |
| [Other sub-databases may also exist] | |
| Data source directory: source_110(2)/ Wire capacitance sub-database: hier_cap.2: | |
| in | 0.01 pF |
| out | 0.02 pF |

The location of the wire capacitance data for a particular net may be determined by locating the record for the appropriate block (i.e., the block in which the net is located) in the data source database 108, which record contains the directory name for the data source directory containing the wire capacitance sub-database of interest. It can be seen from Table 2, that 'source_110(1)' provides a capacitance 0.03 pF for the net 'conn' in the block 'inv-pair', and that 'source_110(2)' provides respective capacitances of 0.01 pF and 0.02 pF for the nets 'in' and 'out' associated with the block 'inv*'.

At step 215, a hierarchical connectivity model 300 is generated for the design portion of interest. In an exemplary embodiment, the hierarchical connectivity model 300 is generated using a single type of data for each block. In this step, processor 102 reads in connectivity data (typically either schematic or layout connectivity) from data of design 109 that provides the full hierarchy of the design portion to be analyzed.

In the exemplary embodiment described above, the present system may generate a mixed-mode result (i.e., including wire capacitance values originating from different data sources) without reading in mixed-mode connectivity information, which often does not produce accurate results. In some cases, the layout hierarchy and schematic hierarchy do not match, and, therefore, when layout connectivity is used for some blocks and schematic connectivity for others, a mismatched hierarchy results which prevents accurate circuit analysis. This embodiment avoids this problem of mismatched hierarchy by selecting either layout or schematic connectivity, and then loading the proper capacitance data onto the connectivity model. Either layout or schematic connectivity is chosen based on what the data source database 108 contains; if all sources for all blocks in the circuit hierarchy are layout related, then the layout connectivity is used. If, however, any of the blocks use schematic or some other connectivity representation (estimated parasitics from another tool, for example), then the schematic connectivity information is used to construct the hierarchical connectivity model. In the present example, assume that the block 'inv-pair' is generated from schematic data, and that each of the blocks 'inv1' and 'inv2' are generated from an instance of 'inv*' which is provided by layout data. If a block has layout available, schematic data is always available; therefore, schematic connectivity information is used to construct the hierarchical connectivity model, as shown in FIG. 3.

In an alternative embodiment, the hierarchical connectivity model is generated by using whichever type of connectivity data is appropriate for each particular block. That is, if layout data is available for a given block, layout connectivity is used, and if no layout is available for a block, then schematic connectivity data is used.

At step 218, the hierarchical connectivity model 300 generated in step 215 and data in the wire capacitance sub-database 112(*) is used to sum wire capacitance for each HLSN in the design portion to be analyzed, while maintaining a data source indicator 103(*) associated with each HLSN (where the '*' character indicates a specific HLSN). In an exemplary embodiment, data source indicators 103(*) are bit 'vectors' in which each bit in the vector indicates a specific data source, although any other type of mechanism for associating an HLSN wire capacitance value with a data source may be used.

In the present exemplary embodiment, an empty data source indicator 103(*) is initially created for each HLSN to be analyzed. As indicated above, all nets in a block have the same source, and there is one sub-database 112(*) per block, as shown in Table 2. The data source database 108 is read and its contents are kept in memory as the connected nets on each HLSN are traversed to determine the wire capacitance for a given HLSN. During this process, the block name in which a particular net piece resides is looked up in source database 108 to get the source type of the wire capacitance data, and the wire capacitance database 112(*) for a particular net is also referenced to determine the wire capacitance value for that net.

In the present example, the HLSN 'conn', which includes the component nets (i.e., net pieces) 'out', 'conn', and 'in', is traversed to determine the wire capacitance for the HLSN 'conn'. The data source directory for the net 'conn' is determined by referring to block 'inv-pair' in data source database 108, since 'conn' is located in the block 'inv-pair'. In similar fashion, the data source directory for the nets 'in' and 'out' is determined by referring to block 'inv-pair' in source database 108, since both nets 'in' and 'out' are located in the block 'inv*'. If there is no corresponding data source found in data source database 108 for any component or element of a particular HLSN, then a 'missing data' bit, indicating that a wire capacitance value is missing, is set in the associated data source indicator 103(*). In certain situations, wire capacitance data may be missing from the wire capacitance database 112(*) for a particular net. Thus, there are two types of potentially missing data: a missing entry in the source database 108; and a missing entry in a particular wire capacitance database 112(*). These two types of missing data can be represented by two different bits being set in data source indicator 103(*), which in the present embodiment, is a bit vector. An abbreviated example of a bit vector format (a typical bit vector may have 32 bits) for data source indicator 103(*) is shown in Table 4 below, with an indication of the significance of indicator bits 0–3:

TABLE 4

SAMPLE BIT VECTOR 103(*) FORMAT

| | Bit Number | | | |
|---|---|---|---|---|
| | 3 | 2 | 1 | 0 |
| Indication | missing source DB entry | missing wire cap. DB entry | data source 110(1) | data source 110(2) |

In the present example, the data source indicator 103 (conn) is generated for the HLSN 'conn', as a bit vector with the following indicia (indicator bits):

a bit indicating that the data source for the net 'conn' is 'source_110(1)'; and a bit indicating that the data source for the nets 'in' and out' (which are both instances of block inv*) is 'source_110(2).

The resulting data source indicator/bit vector 103(conn) (abbreviated to show only the four bits in Table 4) thus has the value '0011'. If it were determined, for example, that there was no data in wire capacitance database 112(*) for one of the net pieces for the HLSN 'conn', then the resulting bit vector 103(conn) would have the value '0111'.

In the present example, the wire capacitance is determined for the HLSN 'conn', which represents the local block nets (or hierarchical net pieces) 'out' (in block 'inv1'), 'conn', and 'in' (in block 'inv2'). As previously defined, an HLSN is the unique signal name that identifies a collection of block nets. In the present example, the signal name 'conn' is identical to the block net 'conn' in inv_pair1. If, for example, the block inv_pair1 were instantiated in a parent block, and the instantiation identified as inv_pair_X, the HLSN would be 'inv_pair_X/conn', which indicates that it is a unique signal name in the parent block's hierarchy. Therefore, when analyzing HLSNs, data is accumulated for an HLSN by collecting data on all of the block nets, including the block net that exists at the highest level, and which provides the signal with its name ('conn' in the present case). The wire capacitance for the HLSN 'conn' (which consists of the net pieces 'in/conn/out') is thus determined from wire capacitance sub-databases 112(hier_cap.1) and 112(hier_cap.2) by summing the wire capacitance values therein for net pieces 'out' (0.02 pF), 'conn' (0.03 pF), and 'in' (0.01 pF), to yield a cumulative wire capacitance value of 0.06 pF. This value is stored in a cumulative wire capacitance indicator 114 (conn) for the HLSN 'conn'. At this point, the data source indicator [103(conn)] for the HLSN 'conn' now contains two 'set' bits indicating that the cumulative wire capacitance value contained in indicator 114(conn) was determined from two sources, specifically 'source_110(1)' and 'source_110 (2)'.

At step 220, processor 102 determines whether there are any missing wire capacitance values by checking the 'missing data' bit in the corresponding data source indicator 103(*) to determine if there is a missing wire capacitance value for any particular net piece. If it is determined that one or more values are missing, then at step 222, any missing values are generated by processor 102, using any desired method. For example, a minimum wire capacitance value may be used for all missing data, or missing data may be generated from design data relating to total signal length and the number of connected devices. The estimation of missing net pieces may be necessitated by mismatches in the hierarchy between layout connectivity and schematic connectivity. For example, if the connectivity representation that is chosen is schematic-based (since not all hierarchical blocks had layout-based data as their best available source), it is possible that a wire capacitance DB may not exist for a block that appears in the schematic hierarchy, because the block name is different, or because that block does not appear in the layout connectivity. In addition, a wire capacitance estimation may be required in the event that a wire capacitance value is nonexistent in source database 108, or if there is a missing entry in a particular wire capacitance database 112(*). Analysis then proceeds with step 230, described below.

If it is determined in step 220 that there are no missing wire capacitance values, then at step 225 a check is made to determine whether all of the wire capacitance data for a particular block is from the most accurate, or 'highest quality source'. Note that the data in the wire capacitance databases 112(*) is the 'best available' data for each block. Using this data, however, may not result in a wire capacitance sum that is entirely composed of 'highest quality' data. Ranked from highest quality to lowest quality, the available wire capacitance data may be in the form of layout, schematics, or estimated with a tool that provides an estimate of the capacitance of a wire, given minimal design information. If the wire capacitance sum is generated entirely from 'highest quality' sources, i.e., from layout data, then system operation proceeds at step 235, wherein, the sum generated in step 218 is used in the circuit analysis. If, however, the wire capacitance sum is not generated entirely from 'highest quality' sources, a wire capacitance estimation is performed (as described above with respect to step 222). To make this determination, the data source indicator 103(*) is examined to determine which sources were used to generate the total wire capacitance value calculated in step 218. The estimate that is generated is based on the design data in memory, but the estimate does not rely on the wire capacitance from the wire capacitance databases 112(*); rather it is a separate number that is used to provide a check against the (possibly optimistic) wire capacitance databases. The higher of the two values calculated in steps 218 and step 222 is then used in the circuit analysis, at step 230.

In the present example, the data source indicator 103 (conn) for the HLSN 'conn' contains two 'set' bits indicating that the cumulative wire capacitance value contained in wire capacitance indicator 114(conn) was determined from two sources, specifically 'source_110(1)' and 'source_110(2)'. The data source database 108 is then checked to determine that the 'best available' source name for block 'inv-pair1' (which contains the net piece 'conn') is 'source_110(1)', which is layout, and the 'best available' data source for block inv* (which contains net pieces 'out' and 'in') is 'source_110(2)', which is schematic data. Therefore, since the wire capacitance data used to generate the sum stored in wire capacitance indicator 114(conn) was not generated entirely from 'highest quality' sources, a wire capacitance estimation is performed, and the higher of the two values calculated in steps 218 and step 222 is used in the analysis of design 109.

Instructions that perform the operation discussed with respect to FIG. 2 may be stored on computer-readable storage media. These instructions may be retrieved and executed by a processor, such as processor 102 of FIG. 1, to direct the processor to operate in accordance with the present system. The instructions may also be stored in firmware. Examples of storage media include memory devices, tapes, disks, integrated circuits, and servers.

Certain changes may be made in the above methods and systems without departing from the scope of the present system. It is to be noted that all matter contained in the above description or shown in the accompanying drawings is to be interpreted as illustrative and not in a limiting sense. For example, the items shown in FIG. 1 may be constructed, connected, arranged, and/or combined in other configurations, and the set of steps illustrated in FIG. 2 may be performed in a different order than shown without departing from the spirit of the present invention.

What is claimed is:

1. A method for determining wire capacitance for a VLSI circuit design, comprising the steps of:
    determining hierarchical blocks of a portion of the design;
    storing, for a plurality of the blocks, indicia of a most accurate one of a plurality of wire capacitance data sources;
    generating a wire capacitance database with an entry for each net, in at least a plurality of the blocks, using information stored in at least one of the wire capacitance data sources;
    generating a hierarchical connectivity model for the design using a single type of connectivity data for each of the blocks; wherein said single type of data is selected from either a layout or a schematic diagram; and
    using the hierarchical connectivity model and said wire capacitance database to determine a cumulative wire capacitance value for each high level signal name (HLSN) in each of the blocks in a portion of the design to be analyzed.

2. The method of claim 1, wherein said cumulative wire capacitance value for each said HLSN is determined by summing the wire capacitance for each said net of each said HLSN.

3. The method of claim 1, wherein said single type of connectivity data is selected from said layout if all of the connectivity data for the portion of the design to be analyzed is available from the layout.

4. The method of claim 1, wherein the hierarchical connectivity model for the design is generated by using layout connectivity, if said layout is available for a given said block, otherwise, if no said layout is available for said given block, then by using schematic connectivity data.

5. The method of claim 1, including the additional steps of:
    maintaining a data source indicator associated with each said HLSN; wherein said data source indicator indicates the name of the data source used to generate said wire capacitance;
    generating an estimated wire capacitance value for each said HLSN in each of the blocks wherein said wire capacitance is not determined entirely from said most accurate source;
    if the data source indicator associated with said HLSN in one of said blocks indicates that the cumulative wire capacitance value is determined entirely from said most accurate source, then using said cumulative wire capacitance value as said wire capacitance for said HLSN; otherwise, if the data source indicator associated with said HLSN in one of said blocks indicates that the cumulative wire capacitance value is not determined entirely from said most accurate source, then using the greater of said estimated wire capacitance value and said cumulative wire capacitance value as said wire capacitance for said HLSN.

6. The method of claim 5, wherein said data source indicator is used to indicate that said wire capacitance for at least one said net in a particular said HLSN is missing from the wire capacitance database.

7. The method of claim 5, wherein said data source indicator is a bit vector in which each of a plurality of specifics bits indicates a corresponding said wire capacitance data source.

8. The method of claim 7, wherein one of the bits in the bit vector is used to indicate that the wire capacitance for a specific said HLSN is missing from the wire capacitance database.

9. A method for determining wire capacitance for a VLSI circuit design, comprising the steps of:
    (a) determining hierarchical blocks of a portion of the design;
    (b) storing, for a plurality of the blocks, indicia of the best available one of a plurality of wire capacitance data sources;
    (c) generating a wire capacitance database with an entry for each net, in at least a plurality of the blocks, using information stored in at least one of the wire capacitance data sources;
    (d) generating a hierarchical connectivity model for the design using a single type of connectivity data for each of the blocks; wherein said single type of data is selected from either a layout or a schematic diagram;
    (e) using the hierarchical connectivity model and said wire capacitance database to determine a cumulative wire capacitance for each high level signal name (HLSN) in each of the blocks in a portion of the design to be analyzed, while maintaining a data source indicator associated with each said HLSN; wherein said data source indicator indicates the name of the data source used to generate said wire capacitance, and wherein the cumulative said wire capacitance for each said HLSN is a total capacitance value determined by summing the wire capacitance for each net in each said HLSN;
    (f) generating an estimated wire capacitance for each said HLSN in each of the blocks wherein said wire capacitance is not determined entirely from said best available source;
    (g) if the data source indicator associated with said HLSN in one of said blocks indicates that the cumulative wire capacitance is determined entirely from said best available source, then using the total capacitance value generated in step (e) as said cumulative wire capacitance; and
    (h) if the data source indicator associated with said HLSN in one of said blocks indicates that the cumulative wire capacitance is not determined entirely from said best available source, then using the greater of the values determined in steps (e) and (f) as said cumulative wire capacitance.

10. The method of claim 9, further comprising the steps of:
    generating an estimated wire capacitance for each said net in each of the blocks for which said wire capacitance is missing from the wire capacitance database; and
    for each said HLSN in each of said blocks, if the data source indicator associated with said HLSN in one of said blocks indicates that the cumulative wire capacitance is missing from the wire capacitance database, then using the greater of the values determined in steps (e) and (f) as said cumulative wire capacitance.

11. The method of claim 10, wherein said data source indicator is used to indicate that said wire capacitance for a given said net is missing from the wire capacitance database.

12. The method of claim 9, wherein said single type of connectivity data is selected from said layout it all of the connectivity data for the portion of the design to be analyzed is available from the layout.

13. The method of claim 9, wherein said data source indicator is a bit vector in which each of a plurality of specifics bits indicates a corresponding said wire capacitance data source.

14. The method of claim 13, wherein one of the bits in the bit vector is used to indicate that the wire capacitance for a specific said HLSN is missing from the wire capacitance database.

15. The method of claim 9, wherein the hierarchical connectivity model for the design is generated by using layout connectivity, if extracted layout data is available for a given said block, otherwise, if no said extracted layout data is available for said given block, then by using schematic connectivity data.

16. A system for determining wire capacitance for a VLSI circuit design comprising:
 a processor coupled to a memory device and a data storage unit;
 a plurality of data sources, coupled to the processor, each of which generate wire capacitance values for each net in a plurality of blocks in the design;
 a wire capacitance database, stored in said data storage unit, wherein said wire capacitance values are stored for each net in a plurality of the blocks in a portion of the design;
 a data source directory, stored in said data storage unit, wherein a name of a data source associated with each said high level signal name (HLSN) in each of the blocks in the design;
 a plurality of data source indicators, accessible by said processor, for storing indicia of the best available one of a plurality of wire capacitance data sources; and
 a plurality of cumulative wire capacitance indicators, accessible by said processor, for storing a cumulative said wire capacitance for each HLSN in each of the blocks in said a portion of the design;
 wherein said processor determines all hierarchical blocks of said portion of the design, and generates a hierarchical connectivity model for the design using a single type of connectivity data for each of the blocks, wherein said single type of data is selected from either a layout or a schematic diagram;
 wherein the hierarchical connectivity model and said wire capacitance database is used to determine a cumulative wire capacitance for each of said HLSNs in each of the blocks in the portion of the design to be analyzed, while maintaining the data source indicator associated with each of said HLSNs; and
 wherein, for each of said HLSNs in each of said blocks, if the data source indicator associated with any of said HLSNs indicates that the cumulative wire capacitance is determined entirely from said best available source, then said cumulative wire capacitance is used as said wire capacitance for each said HLSN in each of said blocks; otherwise, the greater of an estimated wire capacitance and said cumulative wire capacitance is used as said wire capacitance for each of said HLSNs in each of said blocks.

17. The system of claim 16, wherein the cumulative said wire capacitance for each of said HLSNs is determined by summing the wire capacitance for each of the nets in each of said HLSNs.

18. The system of claim 16, wherein:
 an estimated wire capacitance is generated for each said net in each of the blocks for which said wire capacitance is missing from the wire capacitance database; and
 for each of said HLSNs in each of said blocks, if the data source indicator associated with one of said HLSNs in one of said blocks indicates that the cumulative wire capacitance is missing from the wire capacitance database, then using the greater of said estimated wire capacitance and said cumulative wire capacitance is used as said wire capacitance for each corresponding one of said HLSNs in each of said blocks.

19. A system for determining wire capacitance for a VLSI circuit design, comprising:
 means for determining all hierarchical blocks of a portion of the design;
 means for storing, for a plurality of the blocks, indicia of the best available one of a plurality of wire capacitance data sources;
 means for generating a wire capacitance database with an entry for each net in at least a plurality of the blocks, using information stored in at least one of the wire capacitance data sources;
 means for generating a hierarchical connectivity model for the design using a single type of connectivity data for each of the blocks; wherein said single type of data is selected from either a layout or a schematic diagram; and
 means for calculating a cumulative wire capacitance value for each high level signal name (HLSN) in each of the blocks in a portion of the design to be analyzed, using the hierarchical connectivity model and said wire capacitance database.

20. A software product comprising instructions, stored on computer-readable media, wherein the instructions, when executed by a computer, perform steps for determining wire capacitance for a VLSI circuit design, comprising:
 instructions for determining all hierarchical blocks of a portion of the design;
 storing, for a plurality of the blocks, indicia of the best available one of a plurality of wire capacitance data sources;
 instructions for generating a wire capacitance database with an entry for each net in at least a plurality of the blocks, using information stored in at least one of the wire capacitance data sources;
 instructions for generating a hierarchical connectivity model for the design using a single type of connectivity data for each of the blocks; wherein said single type of data is selected from either a layout or a schematic diagram; and
 instructions for using the hierarchical connectivity model and said wire capacitance database to determine a cumulative wire capacitance value for each high level signal name in each of the blocks in a portion of the design to be analyzed.

21. A system for determining wire capacitance for a VLSI circuit design, comprising:
 means for determining all hierarchical blocks of a portion of the design;

means for storing, for a plurality of the blocks, indicia of the most accurate one of a plurality of wire capacitance data sources;
means for generating a wire capacitance database with an entry for each net in at least a plurality of the blocks, using information stored in at least one of the wire capacitance data sources; and
means for generating a hierarchical connectivity model for the design using a single type of connectivity data for each of the blocks; wherein said single type of data is selected from either layout or a schematic diagram;
wherein the hierarchical connectivity model and said wire capacitance database is used to determine a cumulative wire capacitance value for each high level signal name in each of the blocks in a portion of the design to be analyzed.

* * * * *

UNITED STATES PATENT AND TRADEMARK OFFICE
CERTIFICATE OF CORRECTION

PATENT NO. : 7,047,507 B2 Page 1 of 1
APPLICATION NO. : 10/647597
DATED : May 16, 2006
INVENTOR(S) : S. Brandon Keller et al.

It is certified that error appears in the above-identified patent and that said Letters Patent is hereby corrected as shown below:

Title Pg, On page 2, Item (56), under "Other Publications", in column 2, line 19, delete "EV210655520OUS" and insert -- EV210655520US --, therefor.

In column 11, line 5, in Claim 12, delete "it" and insert -- if --, therefor.

Signed and Sealed this

Seventeenth Day of March, 2009

JOHN DOLL
*Acting Director of the United States Patent and Trademark Office*